United States Patent
Lee et al.

(10) Patent No.: US 8,183,068 B2
(45) Date of Patent: May 22, 2012

(54) NITRIDE-BASED SEMICONDUCTOR LIGHT EMITTING DEVICE AND METHOD OF MANUFACTURING THE SAME

(75) Inventors: Jeong-wook Lee, Seongnam-si (KR); Heon-su Jeon, Gunpo-si (KR); Suk-ho Yoon, Seoul (KR); Joo-sung Kim, Yongin-si (KR)

(73) Assignees: Samsung Electro-Mechanics Co., Ltd., Suwon-Si, Gyeonggi-Do (KR); Seoul National University Industry Foundation, Seoul (KR)

( * ) Notice: Subject to any disclaimer, the term of this patent is extended or adjusted under 35 U.S.C. 154(b) by 19 days.

(21) Appl. No.: 12/721,063

(22) Filed: Mar. 10, 2010

(65) Prior Publication Data

US 2010/0163912 A1  Jul. 1, 2010

Related U.S. Application Data

(62) Division of application No. 11/525,096, filed on Sep. 22, 2006, now Pat. No. 7,888,694.

(30) Foreign Application Priority Data

Feb. 10, 2006 (KR) .......... 10-2006-0012915

(51) Int. Cl.
*H01L 33/00* (2010.01)

(52) U.S. Cl. .......... 438/29; 257/98; 257/E33.013; 257/E33.067; 438/46

(58) Field of Classification Search .......... 257/98, 257/E33.013, E33.067; 438/29, 46
See application file for complete search history.

(56) References Cited

U.S. PATENT DOCUMENTS

| | | |
|---|---|---|
| 5,779,924 A | 7/1998 | Krames et al. |
| 6,781,160 B1 | 8/2004 | Tsai et al. |
| 6,975,664 B1 | 12/2005 | Dodabalapur et al. |
| 7,187,007 B2 | 3/2007 | Kim et al. |
| 7,317,212 B2 | 1/2008 | Shin |
| 2004/0089869 A1 | 5/2004 | Uemura |
| 2004/0142503 A1* | 7/2004 | Lee et al. .......... 438/47 |
| 2004/0188689 A1 | 9/2004 | Shono et al. |

(Continued)

FOREIGN PATENT DOCUMENTS

CN  1652363 A  8/2005

(Continued)

OTHER PUBLICATIONS

Office Action mailed Apr. 21, 2008 from Korean Intellectual Property Office.

(Continued)

*Primary Examiner* — Hung Vu
*Assistant Examiner* — Vernon P Webb
(74) *Attorney, Agent, or Firm* — Buchanan Ingersoll & Rooney PC

(57) ABSTRACT

A nitride-based semiconductor light emitting device having an improved structure in which light extraction efficiency is improved and a method of manufacturing the same are provided. The nitride-based semiconductor light emitting device comprises an n-clad layer, an active layer, and a p-clad layer, which are sequentially stacked on a substrate, wherein the n-clad layer comprises a first clad layer, a second clad layer, and a light extraction layer interposed between the first clad layer and the second clad layer and composed of an array of a plurality of nano-posts, the light extraction layer diffracting or/and scattering light generated in the active layer.

13 Claims, 5 Drawing Sheets

U.S. PATENT DOCUMENTS

| | | |
|---|---|---|
| 2004/0189184 A1 | 9/2004 | Yasuda |
| 2005/0082562 A1* | 4/2005 | Ou et al. .................. 257/103 |
| 2005/0145872 A1 | 7/2005 | Fang et al. |
| 2005/0173718 A1 | 8/2005 | Shin |
| 2006/0006407 A1 | 1/2006 | Kim et al. |
| 2006/0071233 A1* | 4/2006 | Cho et al. .................. 257/103 |
| 2006/0202226 A1 | 9/2006 | Weisbuch et al. |
| 2006/0278880 A1 | 12/2006 | Lee et al. |

FOREIGN PATENT DOCUMENTS

| | | | |
|---|---|---|---|
| EP | 1429396 A1 | 6/2004 | |
| EP | 1562238 A2 | 8/2005 | |
| JP | 11-274642 A | 8/1999 | |
| JP | 2001-358364 | 12/2001 | |
| JP | 2004-311973 | 11/2004 | |
| JP | 2005-223329 | 8/2005 | |
| JP | 2008-536294 | 9/2006 | |
| KR | 2005-37324 A | 4/2005 | |
| KR | 2005-0079279 A | 8/2005 | |
| KR | 2005-87584 A | 8/2005 | |
| KR | 2005-0096509 A | 10/2005 | |
| KR | 2006-0004314 A | 1/2006 | |
| WO | WO 2004/057682 A1 | 7/2004 | |

OTHER PUBLICATIONS

Korean Office Action dated Apr. 21, 2008 (re: Korean Appln. No. 2006-14241) & English translation.
Chinese Office Action dated Jul. 11, 2008 and English translation.
Office Action issued on Apr. 6, 2011 in corresponding Chinese Patent Application No. 200610128599.2.
Extended European Search Report mailed Feb. 16, 2010.
Dong-Ho Kim et al., "Enhanced light extraction from GaN-based light-emitting diodes with holographically generated two-dimensional photonic crystal patterns", Applied Physics Letters, AIP, American Institute of Physics, Melville, NY, Nov. 10, 2005, vol. 87, No. 20, 3 pages.
Dong-Ho Kim et al., "Extraction efficiency enhancement in GaN-based light emitters grown on a holographically nano-patterned sapphire substrate", Quantum Electronics and Laser Science, 2005 Conference, Baltimore, MD, May 22-27, 2005, Piscataway, NJ, IEEE, pp. 1268-1271, vol. 2.
Hideki Hirayama et al., "High-efficiency 350 nm-band quaternary InAlGaN-based UV-LED on GaN/sapphire template", Physica Status Solidi C Wiley—VCH Germany, Apr. 1, 2005, pp. 2899-2902, vol. 2, No. 7.
Office Action issued on Jul. 27, 2010 in corresponding Korean Patent Application No. 10-2009-0079370.
Office Action issued on Jul. 30, 2010, issued in corresponding Chinese Patent Application No. 200610128599.2.
Examination Report dated Aug. 31, 2011, issued in corresponding European Patent Application No. 06118864.5.
Office Action, with translation, issued on Jan. 31, 2012 in the co-pending Japanese Patent Application No. 2007-030961, 10 pages.

* cited by examiner

NITRIDE-BASED SEMICONDUCTOR LIGHT EMITTING DEVICE AND METHOD OF MANUFACTURING THE SAME

CROSS-REFERENCE TO RELATED PATENT APPLICATIONS

This application claims the benefit of Korean Patent Application No. 10-2006-0012915, filed on Feb. 10, 2006, in the Korean Intellectual Property Office, the disclosure of which incorporated herein in its entirety by reference.

BACKGROUND OF THE DISCLOSURE

1. Field of the Disclosure

The present disclosure relates to a semiconductor light emitting device, and more particularly, to a nitride-based semiconductor light emitting device having an improved structure in which light extraction efficiency is improved, and a method of manufacturing the same.

2. Description of the Related Art

Light emitting devices, such as light emitting diodes (LED), are basically semiconductor PN junction diodes. The silicon PN junction plays a leading role in the electronic information revolution, and the PN junction of a III-V group compound semiconductor plays a leading role in the light revolution. A III-V group compound semiconductor is made by the combining of III- and V-group elements of the periodic table of elements. It has an advantage of luminous efficiency that is near 100%. This luminous efficiency is approximately one thousand times higher than that of silicon. Thus, LEDs are widely used in light emitting devices, such as a diode laser, from the initial stage of development of a material and play a leading role in the optical revolution. In addition, since LEDs have a higher movement speed of electrons and can operate at a high temperature, they are widely used in high-speed and high-power electronic devices. In particular, several III- and V-group elements are mixed with one another so that a semiconductor having a variety of material compositions and characteristics can be manufactured.

As basic characteristics of an LED, luminosity (units: candela (cd)) is used in an LED in a visible ray region and radiant flux (units: watt) is used in an invisible ray region. Luminosity is indicated by light velocity per unit cubic angle, and brightness is indicated by luminosity per unit area. A photometer is used to measure luminosity. Radiant flux represents all power radiated from all wavelengths of an LED and is indicated by the energy radiated per unit time.

A major factor for determining visible ray LED performance is the luminous efficiency indicated by lumen per watt (lm/W). This corresponds wall-plug efficiency (optical output/input electric power amount) in consideration of human eye luminosity factor. Luminous efficiency of an LED can be mainly determined by three factors, such as internal quantum efficiency, extraction efficiency, and operating voltage. Research for the improvement of the luminous efficiency is being currently conducted.

In general, conventional LEDs have a sapphire/n-GaN/MQW/p-GaN structure. However, in such LEDs, defect density is high due to the limitations of manufacturing technology. Thus, there are limitations when addressing current technical objectives, such as a first objective of improving the internal quantum efficiency of an MQW layer and a second objective of manufacturing a high-power LED. Accordingly, the structure of a LED needs to be improved so that the limitations can be overcome and the external extraction efficiency of light can be increased.

SUMMARY OF THE DISCLOSURE

The present invention may provide a nitride-based semiconductor light emitting device having an improved structure in which the light extraction efficiency is improved, and a method of manufacturing the same.

According to an aspect of the present invention, there may be provided nitride-based semiconductor light emitting device comprising an n-clad layer, an active layer, and a p-clad layer, which are sequentially stacked on a substrate, wherein the n-clad layer comprises a first clad layer, a second clad layer, and a light extraction layer interposed between the first clad layer and the second clad layer and is composed of an array of a plurality of nano-posts, the light extraction layer diffracting or/and scattering light generated in the active layer.

The nano-posts may be formed of a material having a different refraction index from a material used in forming the first clad layer and the second clad layer. The nano-posts may be formed of a light transmission material having a refraction index of 2.5 and less. Specifically, the nano-posts may be formed of a transparent material with respect to a wavelength in a range of approximately 200-780 nm. For example, the nano-posts may be formed of a material selected from the group consisting of $SiO_2$, $SiN_x$, $Al_2O_3$, HfO, $TiO_2$, ZrO, and ZnO or by adding a material selected from the group consisting of Mg, Ag, Zn, Sc, Hf, Zr, Te, Se, Ta, W, Nb, Cu, Si, Ni, Co, Mo, Cr, Mn, Hg, Pr, and La to an indium oxide. The first clad layer and the second clad layer may be formed of an AlInGaN-based III-V-group nitride semiconductor material. The first clad layer and the second clad layer may be formed of substantially the same material.

An arrangement period of the nano-posts may be approximately 100-2000 nm, for example, approximately 700 nm. A height of each of the nano-posts may be approximately 100-1000 nm, for example, approximately 300 nm. A diameter of each of the nano-posts may be approximately 100-1000 nm.

According to another aspect of the present invention, there is provided a method of manufacturing a nitride-based semiconductor light emitting device, the method comprising sequentially forming an n-clad layer, an active layer, and a p-clad layer on a substrate, wherein the forming of the n-clad layer comprises: forming a first clad layer on the substrate; forming a light transmission material layer on the first clad layer; patterning the light transmission material layer to form a light extraction layer composed of an array of a plurality of nano-posts and diffracting or/and scattering light generated in the active layer; and forming a second clad layer for embedding the light extraction layer on the first clad layer.

The patterning of the light transmission material layer may be performed using a hologram lithography method.

The light transmission material layer may be formed of a material having a different refraction index from a material used in forming the first clad layer and the second clad layer.

The light transmission material layer may be formed of a light transmission material having a refraction index of approximately 2.5 or less. Specifically, the light transmission material layer may be formed of a transparent material with respect to a wavelength in a range of approximately 200-780 nm. For example, the light transmission material layer may be formed of a material selected from the group consisting of $SiO_2$, $SiN_x$, $Al_2O_3$, HfO, $TiO_2$, ZrO, and ZnO or by adding a material selected from the group consisting of Mg, Ag, Zn, Sc, Hf, Zr, Te, Se, Ta, W, Nb, Cu, Si, Ni, Co, Mo, Cr, Mn, Hg, Pr, and La to an indium oxide. The first clad layer and the second clad layer may be formed of an AlInGaN-based III-V-group nitride semiconductor material. The first clad layer and the second clad layer may be formed of substantially the same material.

An arrangement period of the nano-posts may be approximately 100-2000 nm, for example, approximately 700 nm. A height of each of the nano-posts may be approximately 100-1000 nm, for example, approximately 300 nm. A diameter of each of the nano-posts may be approximately 100-1000 nm.

According to the present invention, a nitride-based semiconductor light emitting device having an improved structure in which the light extraction efficiency is improved can be obtained.

BRIEF DESCRIPTION OF THE DRAWINGS

The above and other aspects of the present invention will be illustrated in detailed exemplary embodiments thereof with reference to the attached drawings in which.

DETAILED DESCRIPTION OF EXEMPLARY EMBODIMENTS

Figure 1:
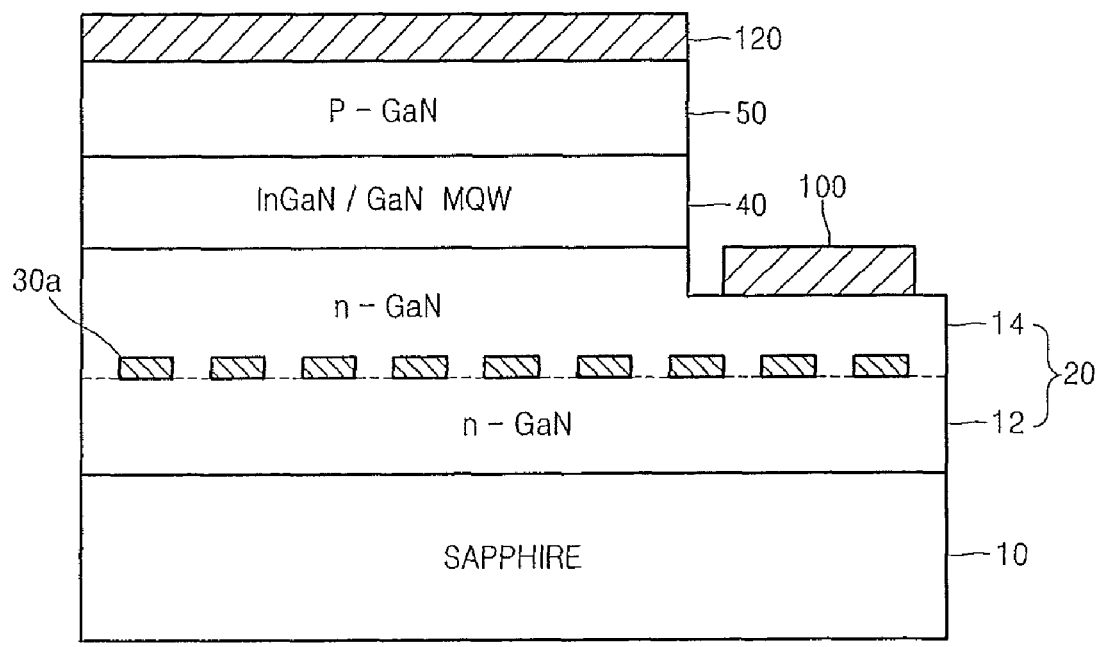
FIG. 1 is a cross-sectional view of a nitride-based semiconductor light emitting device according to an embodiment of the present invention.

The present invention will now be described more fully with reference to the accompanying drawings, in which exemplary embodiments of the invention are shown. In the drawings, the thicknesses of layers and regions are exaggerated for clarity.

FIG. 1 is a cross-sectional view of a nitride-based semiconductor light emitting device according to an embodiment of the present invention. Referring to FIG. 1, the nitride-based semiconductor light emitting device includes an n-clad layer 20, an active layer 40, and a p-clad layer 50, which are sequentially stacked on a substrate 10. In particular, the n-clad layer 20 includes a first clad layer 12, a second clad layer 14, and a light extraction layer 30a composed of an array of a plurality of nano-posts interposed between the first clad layer 12 and the second clad layer 14. An n-electrode 100 and a p-electrode 120 are formed on an etched surface of the n-clad layer 20 and on the p-clad layer 50, respectively.

The substrate 10 may be one of Si, GaAs, SiC, GaN, and sapphire substrates. The n-clad layer 20 may be formed of an AlInGaN-based group nitride semiconductor material, for example, an n-GaN layer. The p-clad layer 50 may be formed of a p-GaN-based III-V-group nitride semiconductor layer, for example, a p-GaN layer or a p-GaN/AlGaN layer.

The active layer 40 may be formed of a GaN-based III-V-group nitride semiconductor layer which is $In_xAl_yGa_{1-x-y}N$ ($0 \leq x \leq 1$, $0 \leq y \leq 1$ and $0 \leq x+y \leq 1$), for example, an InGaN layer or an AlGaN layer. Here, the active layer 40 may have one structure of a multi-quantum well (MQW) or a single quantum well. The structure of the active layer 40 does not restrict the technical scope of the present invention. For example, the active layer 40 may be formed of GaN/InGaN/GaN MQW or GaN/AlGaN/GaN MQW.

In the nitride-based semiconductor light emitting device having the above structure, if a predetermined voltage is applied between the n-electrode 100 and the p-electrode 120, electrons and holes are injected into the active layer 40 from the n-clad layer 20 and the p-clad layer 50, respectively, and are combined in the active layer 40 so that light can be output from the active layer 40.

According to the present invention, the n-clad layer 20 includes the first clad layer 12, the second clad layer 14, and the light extraction layer 30a composed of an array of a plurality of nano-posts interposed between the first clad layer 12 and the second clad layer 14. Here, the light extraction layer 30a can perform the function of increasing external extraction efficiency of light by diffracting or/and scattering light generated in the active layer 40. Here, an arrangement period of the nano-posts is approximately 100-2000 nm and may be approximately 700 nm. A height of each of the nano-posts is approximately 100-1000 nm and preferably may be approximately 300 nm. A diameter of each of the nano-posts may be approximately 100-1000 nm.

The first clad layer 12 and the second clad layer 14 are formed of an AlInGaN-based III-V-group nitride semiconductor material. Here, the first clad layer 12 and the second clad layer 14 may be formed of substantially the same material, for example, an n-GaN material. The nano-posts can be formed of a material having a different refraction index from a material used in forming the first clad layer 12 and the second clad layer 14. Specifically, the nano-posts are formed of a light transmission material having a refraction index of approximately 2.5 or less and may be formed of a transparent material with respect to a wavelength in a range of approximately 200-780 nm. The illustrated wavelength range may include a wavelength range of UV and all visible ray regions. For example, the nano-posts may be formed of a material selected from the group consisting of $SiO_2$, $SiN_x$, $Al_2O_3$, HfO, $TiO_2$, ZrO, and ZnO or by adding a material selected from the group consisting of Mg, Ag, Zn, Sc, Hf, Zr, Te, Se, Ta, W, Nb, Cu, Si, Ni, Co, Mo, Cr, Mn, Hg, Pr, and La to an indium oxide. Here, as examples of an indium oxide to which the material is added, are an indium tin oxide (ITO) or a copper-doped indium oxide (CIO) material.

According to the present invention, the light extraction layer 30a composed of an array of a plurality of nano-posts is embedded in the n-clad layer 20. The light extraction layer 30a can increase external extraction efficiency of light by diffracting or/and scattering light generated in the active layer 40. Thus, light extraction efficiency can be improved compared to the prior art.

Figure 2:
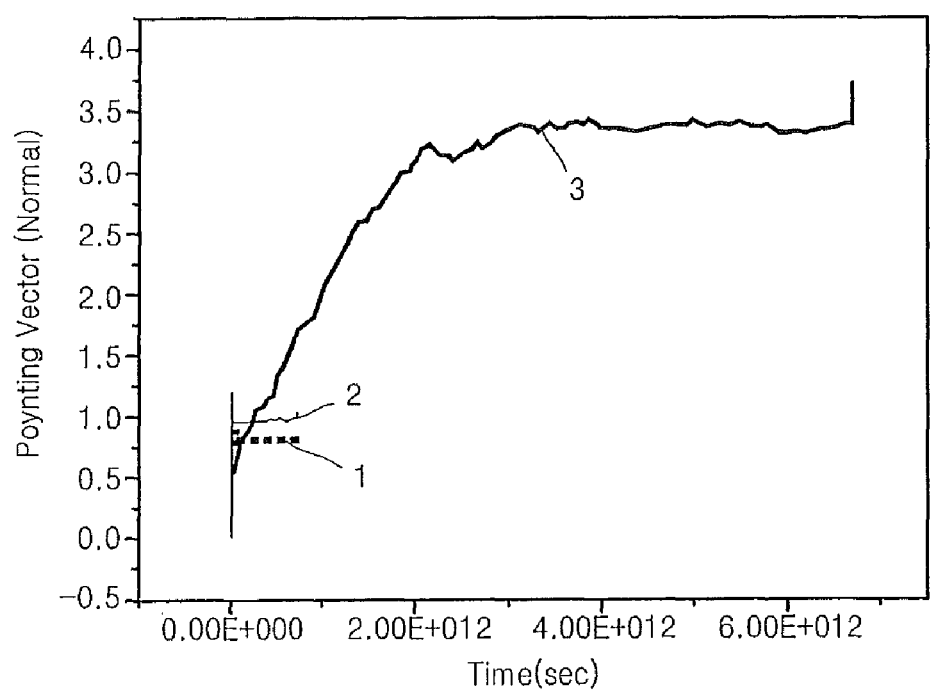
FIG. 2 is a graph showing simulation results of light extraction improvement of the nitride-based semiconductor light emitting device illustrated in FIG. 1.

FIG. 2 is a graph showing simulation results of light extraction improvement of the nitride-based semiconductor light emitting device illustrated in FIG. 1. Graph 1 (dotted line) shows a light output of an LED having a conventional sapphire/n-GaN/MQW/p-GaN structure, and Graph 2 (thin solid line) shows a light output of an LED having a conventional epitaxial lateral overgrowth (ELOG) pattern. For a structure of an LED having an ELOG pattern, refer to U.S. Pat. No. 6,051,849 which is herein incorporated by reference. Graph 3 (thick solid line) shows a light output of a nitride-based semiconductor light emitting device according to the present invention.

FIGS. 3A through 3G are flowcharts illustrating a method of manufacturing a nitride-based semiconductor light emitting device according to an embodiment of the present invention.

Figure 3A:
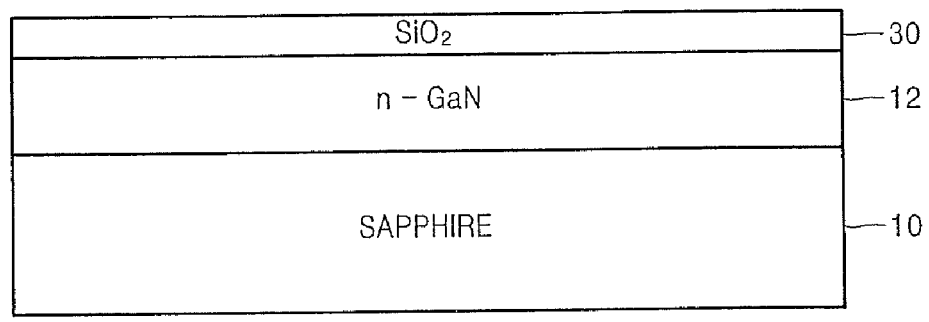
FIGS. 3A through 3G are flowcharts illustrating a method of manufacturing a nitride-based semiconductor light emitting device according to an embodiment of the present invention.

Referring to FIG. 3A, the first clad layer 12 is formed on the prepared substrate 10, such as, Si, GaAs, SiC, GaN or a sapphire substrate, using the same type of stacking method, for example, a GaN-based crystalline layer growth on a GaN substrate, or a different type of stacking method, for example, a GaN-based crystalline growth on a sapphire substrate. The first clad layer 12 may be formed of an AlInGaN-based III-V-group nitride semiconductor material, for example, an n-GaN layer. Then, a light transmission material layer 30 is formed of a material having a different refraction index than that of the material used when forming the first clad layer 12 on the first clad layer 12. Specifically, the light transmission material layer 30 may be formed of a light transmission material having a refraction index of approximately 2.5 or less, for example, may be formed of a transparent material with respect to a wavelength in a range of approximately 200-780 nm. The illustrated wavelength range may include a wavelength range of UV and all visible ray regions. For example, the light transmission material layer 30 may be formed of a material selected from the group consisting of $SiO_2$, $SiN_x$, $Al_2O_3$, HfO, $TiO_2$, ZrO, and ZnO or by adding a material selected from the group consisting of Mg, Ag, Zn, Sc, Hf, Zr, Te, Se, Ta, W, Nb, Cu, Si, Ni, Co, Mo, Cr, Mn, Hg, Pr, and La to an indium oxide. Here, as an example of an indium oxide to which the material is added, there is an indium tin oxide (ITO) or a copper-doped indium oxide (CIO) material.

Here, the n-clad layer 20 and the light transmission material layer 30 may be formed using vapor deposition, such as halide or hydride vapor phase epitaxy (HVPE), metal organic chemical vapor deposition (MOCVD), molecular beam epitaxy (MBE), plasma enhanced chemical vapor deposition (PECVD) or evaporation. Since the methods are well-known in the art, a detailed description thereof will be omitted.

Figure 3B:
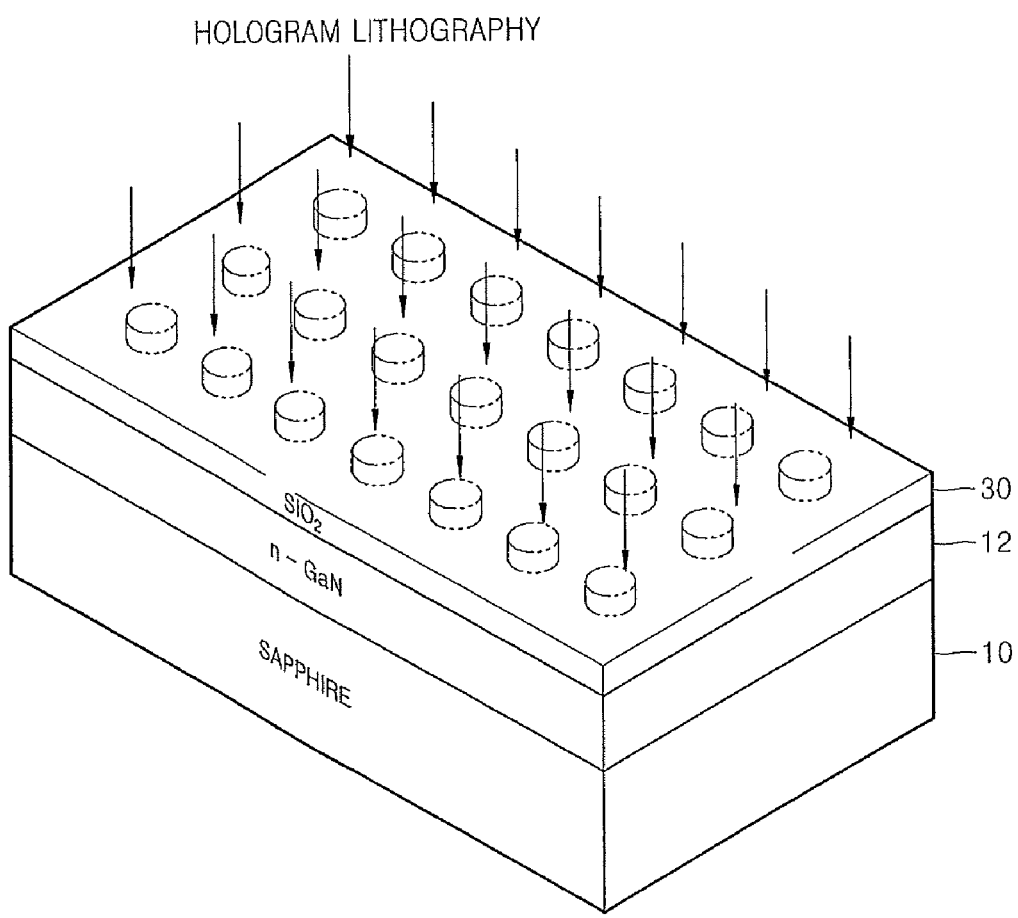
Figure 3C:
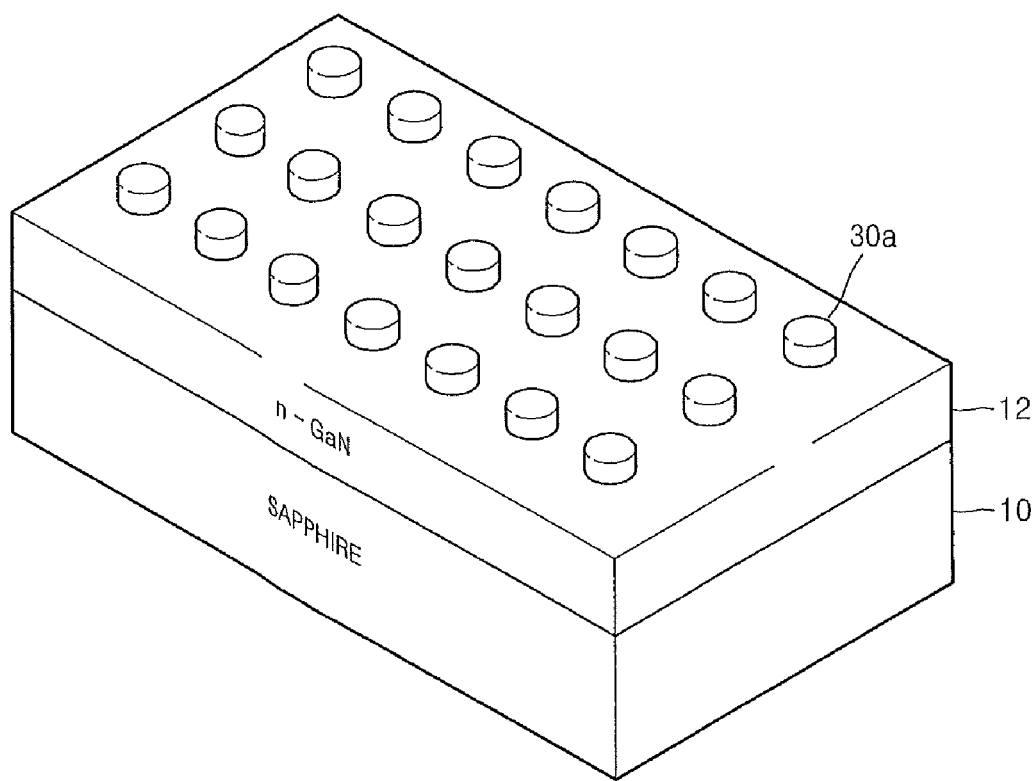

Referring to FIGS. 3B and 3C, the light transmission material layer 30 is patterned, thereby forming the light extraction layer 30a composed of an array of a plurality of nano-posts. Here, patterning of the light transmission material layer 30 can be performed using a hologram lithography method. The light extraction layer 30a can perform the function of increasing the external extraction efficiency of light by diffracting or/and scattering light generated in the active layer 40 which will be formed later.

Here, an arrangement period of the nano-posts is approximately 100-2000 nm and may be 700 nm. A height of each of the nano-posts is approximately 100-1000 nm and preferably may be 300 nm. A diameter of each of the nano-posts may be approximately 100-1000 nm.

Figure 3D:
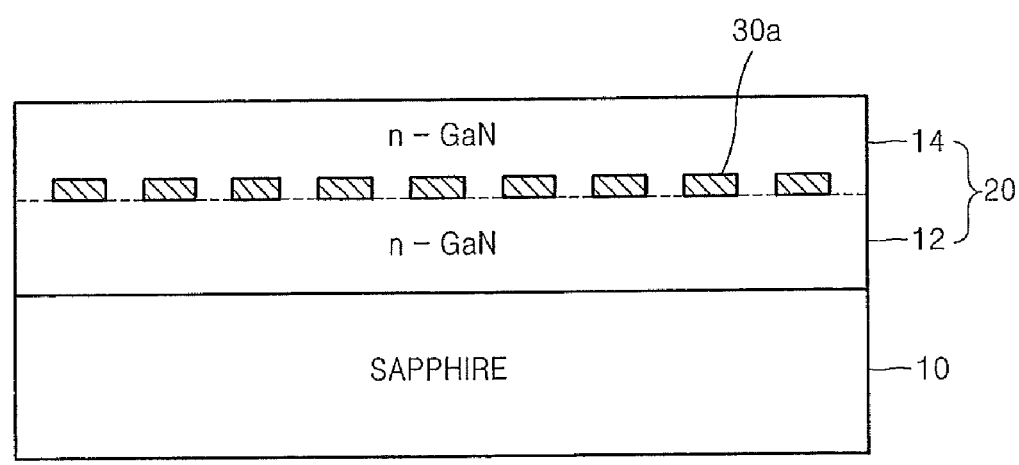
Figure 3E:
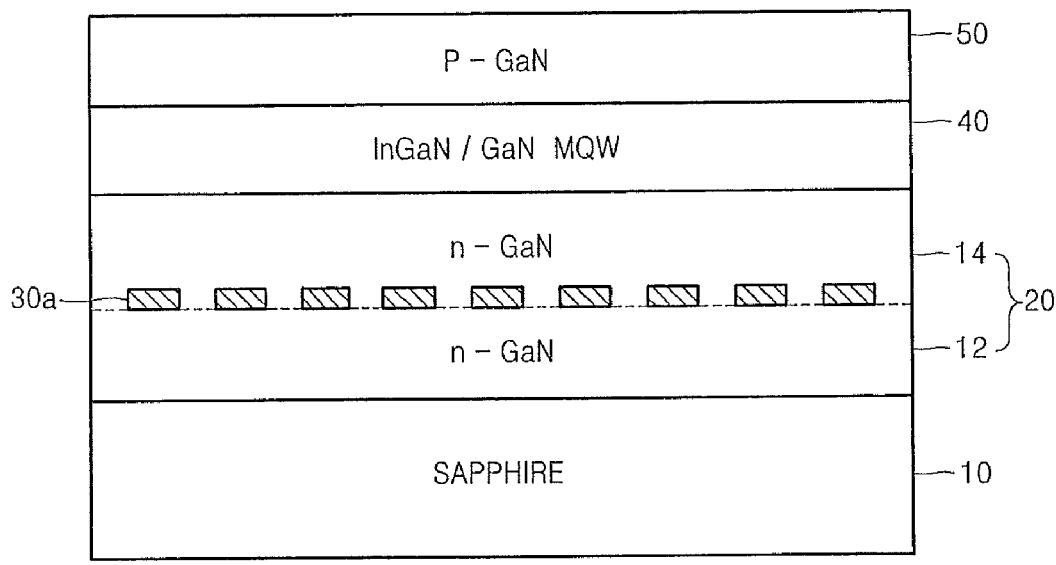

Referring to FIGS. 3D and 3E, the second clad layer 14 for embedding the light extraction layer 30a is formed on the first clad layer 12. The second clad layer 14 constitutes the n-clad layer 20 together with the first clad layer 12. Here, the second clad layer 14 is formed of an AlInGaN-based III-V-group nitride semiconductor material. The second clad layer 14 may be formed of substantially the same material as the first clad layer 12. For example, the second clad layer 14 may be formed of an n-GaN layer. The second clad layer 14 can be formed using the same method as the method used when forming the first clad layer 12, such as, HVPE, MOCVD, MBE, PECVD, sputtering or evaporation.

Then, the active layer 40 and the p-clad layer 50 are sequentially formed on the second clad layer 14. Here, the active layer 40 and the p-clad layer 50 can be formed using vapor deposition, such as HVPE, MOCVD or MBE.

The active layer 40 may be formed of a GaN-based III-V-group nitride semiconductor layer which is $In_xAl_yGa_{1-x-y}N$ ($0 \leq x \leq 1$, $0 \leq y \leq 1$ and $0 \leq x+y \leq 1$), for example, an InGaN layer or an AlGaN layer. Here, the active layer 40 may have one structure be of a multi-quantum well (MQW) or a single quantum well. The structure of the active layer 40 does not restrict the technical scope of the present invention. For example, the active layer 40 may be formed of GaN/InGaN/GaN MQW or GaN/AlGaN/GaN MQW.

The p-clad layer 50 may be formed of a p-GaN-based III-V-group nitride semiconductor layer, for example, a p-GaN layer or a p-GaN/AlGaN layer.

Figure 3F:
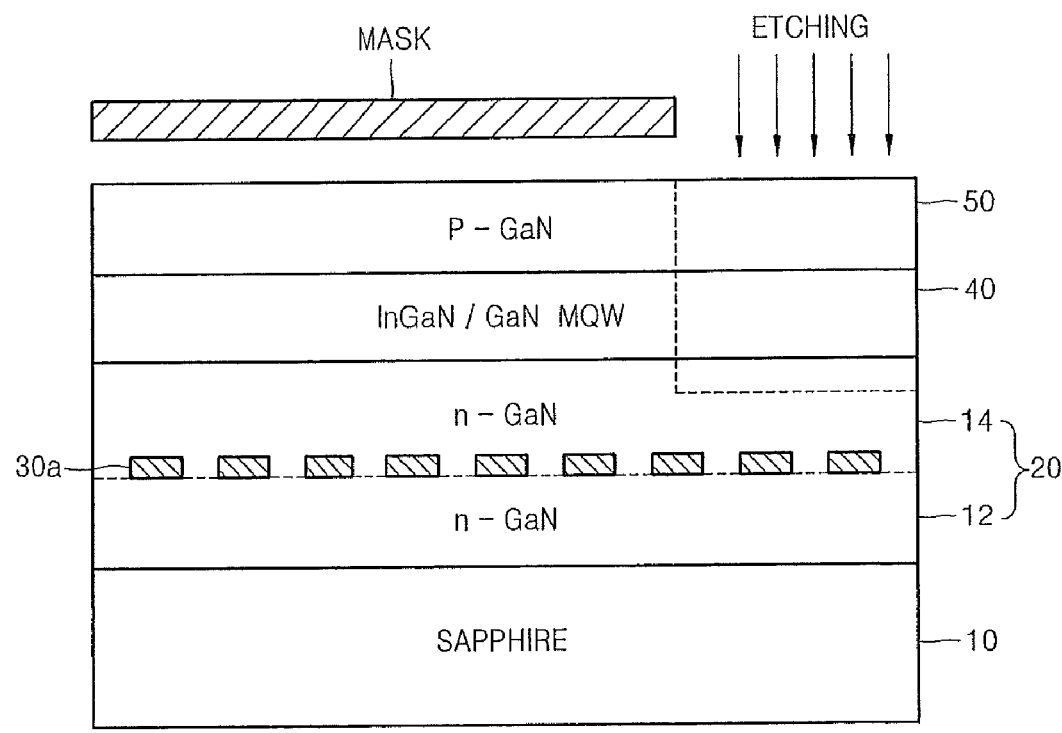
Figure 3G:
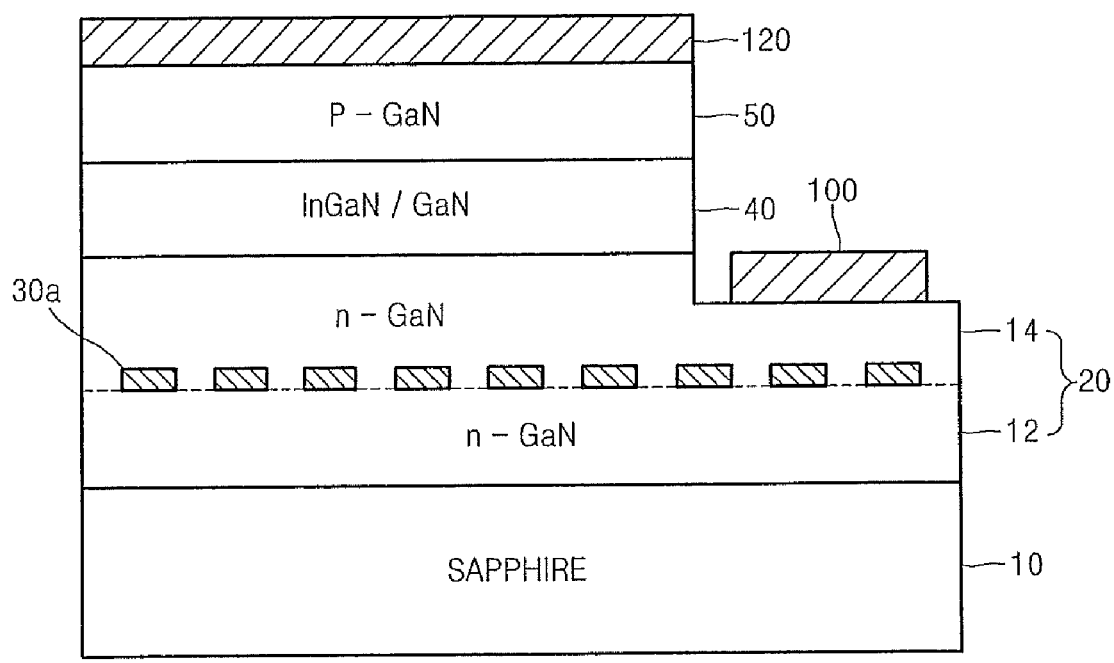

Referring to FIGS. 3F and 3G, firstly, a top surface of the p-clad layer 50 is etched to a predetermined depth of the n-clad layer 20, thereby forming an etched surface on the n-clad layer 20. Next, the n-electrode 100 and the p-electrode 200 are formed of a conductive material, such as Ag, Au or indium tin oxide (ITO), on the etched surface of the n-clad layer 20 and the p-clad layer 50. The nitride-based semiconductor light emitting device according to the present invention can be manufactured using the above processes.

According to the present invention, the nitride-based semiconductor light emitting device having an improved structure in which the light extraction efficiency is improved can be obtained. According to the present invention, the light extraction layer composed of an array of a plurality of nano-posts is embedded in the n-clad layer. The light extraction layer can increase external extraction efficiency of light by diffracting or/and scattering light generated in the active layer. Thus, the light extraction efficiency can be improved compared to the prior art.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. A method of manufacturing a nitride-based semiconductor light emitting device, the method comprising sequentially forming an n-clad layer, an active layer, and a p-clad layer on a substrate, wherein the forming of the n-clad layer comprises:
   forming a first clad layer on the substrate;
   forming a light transmission material layer on an upper surface of the first clad layer;
   patterning the light transmission material layer to form a light extraction layer composed of an array of a plurality of nano-posts and diffracting or/and scattering light generated in the active layer; and
   forming a second clad layer for embedding the light extraction layer on the first clad layer,
   wherein the first clad layer and the second clad layer are formed of substantially the same material,
   wherein the plurality of nano-posts are wholly encompassed by the substantially same material forming the first and second clad layers.

2. The method of claim 1, wherein the patterning of the light transmission material layer is performed using a hologram lithography method.

3. The method of claim 1, wherein the light transmission material layer is formed of a material having different refraction index from a material used in forming the first clad layer and the second clad layer.

4. The method of claim 3, wherein the light transmission material layer is formed of a light transmission material having a refraction index of approximately 2.5 or less.

5. The method of claim 4, wherein the light transmission material layer is formed of a transparent material with respect to a wavelength in a range of approximately 200-780 nm.

6. The method of claim 3, wherein the light transmission material layer is formed of a material selected from the group consisting of $SiO_2$, $SIN_x$, $Al_2O_3$, HfO, $TiO_2$, ZrO, and ZnO or by adding a material selected from the group consisting of Mg, Ag, Zn, Sc, Hf, Zr, Te, Se, Ta, W, Nb, Cu, Si, Ni, Co, Mo, Cr, Mn, Hg, Pr, and La to an indium oxide.

7. The method of claim 1, wherein an arrangement period of the nano-posts is approximately 100-2000 nm.

8. The method of claim 7, wherein an arrangement period of the nano-posts is approximately 700 nm.

9. The method of claim 1, wherein a height of each of the nano-posts is approximately 100-1000 nm.

10. The method of claim 9, wherein a height of each of the nano-posts is approximately 300 nm.

11. The method of claim 1, wherein a diameter of each of the nano-posts is approximately 100-1000 nm.

12. The method of claim 1, wherein the first clad layer and the second clad layer are formed of an AlInGaN-based III-V-group nitride semiconductor material.

13. A nitride-based semiconductor light emitting device manufactured by the method of claim 1.

* * * * *